United States Patent
Gao et al.

(10) Patent No.: US 9,437,693 B2
(45) Date of Patent: Sep. 6, 2016

(54) DEVICE HAVING A SHIELD PLATE DOPANT REGION AND METHOD OF MANUFACTURING SAME

(71) Applicants: Zihao M. Gao, Gilbert, AZ (US); David C. Burdeaux, Tempe, AZ (US); Agni Mitra, Gilbert, AZ (US)

(72) Inventors: Zihao M. Gao, Gilbert, AZ (US); David C. Burdeaux, Tempe, AZ (US); Agni Mitra, Gilbert, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/572,773

(22) Filed: Dec. 17, 2014

(65) Prior Publication Data

US 2016/0181378 A1 Jun. 23, 2016

(51) Int. Cl.
*H01L 29/76* (2006.01)
*H01L 29/40* (2006.01)
*H01L 29/78* (2006.01)
*H01L 29/66* (2006.01)

(52) U.S. Cl.
CPC ....... *H01L 29/402* (2013.01); *H01L 29/66681* (2013.01); *H01L 29/7816* (2013.01)

(58) Field of Classification Search
CPC .............. H01L 39/66681; H01L 29/1095; H01L 29/7813; H01L 29/0696; H01L 29/407; H01L 29/7816; H01L 29/66681; H01L 29/402; H01L 29/66712
USPC .......................................................... 257/339
See application file for complete search history.

(56) References Cited

U.S. PATENT DOCUMENTS

| | | | | |
|---|---|---|---|---|
| 5,352,617 A * | 10/1994 | Miwa | .................. | H01L 21/8248 257/E21.695 |
| 6,465,845 B1 * | 10/2002 | Baek | .................. | H01L 29/0847 257/343 |
| 7,820,517 B2 * | 10/2010 | Gammel | ................ | H01L 29/402 257/E21.417 |
| 7,989,879 B2 * | 8/2011 | Van Rijs | ................ | H01L 29/402 257/288 |
| 8,314,000 B2 | 11/2012 | Hsieh | | |
| 8,592,274 B2 | 11/2013 | Tsuchiko | | |
| 8,680,615 B2 | 3/2014 | Mitra et al. | | |
| 2013/0146973 A1 * | 6/2013 | Mitra | ................ | H01L 29/66719 257/335 |
| 2014/0042522 A1 * | 2/2014 | Li | ........................ | H01L 29/7816 257/328 |
| 2014/0131796 A1 | 5/2014 | Zhou et al. | | |
| 2014/0187012 A1 * | 7/2014 | Mitra | ................ | H01L 29/66719 438/304 |

* cited by examiner

*Primary Examiner* — Thanh T Nguyen

(57) ABSTRACT

A transistor includes a surface region, a gate, a source dopant region, a drain dopant region, a drift dopant region, a set of electrically conductive shield plates, and a shield plate dopant region. A sidewall of the gate aligns with a drain side boundary of the surface region. The drain dopant region is within the surface region on the drain side. The drift dopant region is within the surface region between the drain side boundary and the drain dopant region. The set of electrically conductive shield plates includes a first shield plate overlying the drift dopant region. The shield plate dopant region is within the drift dopant region and underlies the set of shield plates.

18 Claims, 4 Drawing Sheets

DEVICE HAVING A SHIELD PLATE DOPANT REGION AND METHOD OF MANUFACTURING SAME

FIELD

The present disclosure relates generally to current producing devices and more particularly to a device having a shield plate dopant region and method of manufacturing same.

BACKGROUND

Current producing devices, such as transistors, are used in various applications. Techniques, such as the inclusion of one or more electrically conductive shield plates within the transistors, are employed to tailor one or more characteristics or parameters of the transistors to make them more suitable for high power applications. These transistor parameters include, but are not limited to, breakdown voltage ($BV_{dss}$) and on-state resistance ($R_{dson}$). $R_{dson}$ characterizes the resistive behavior between source and drain terminals of a transistor in the on-state. $BV_{dss}$ characterizes the voltage and current blocking capability between the source and drain terminals when the transistor is in the off-mode. Ideally, transistors used in high power applications are characterized by a relatively high $BV_{dss}$ and a relatively low $R_{dson}$, to increase output power and efficiency of the transistors.

Conventional transistor design approaches can result in a trade-off between two or more transistor parameters. For example, for at least some transistor types, the $BV_{dss}$ is proportional to drift length, which is the lateral distance between the gate and the drain. However, an increased drift length and correspondingly higher $BV_{dss}$ causes an undesirably higher $R_{dson}$, thereby, decreasing the transistor's effectiveness for high power applications.

BRIEF DESCRIPTION OF THE DRAWINGS

In the accompanying figures, like reference numerals refer to identical or functionally similar elements throughout the separate views. The figures together with the detailed description below are incorporated in and form part of the specification. Moreover, the figures and the detailed description serve to further illustrate embodiments of concepts that include the claimed embodiments and explain various principles and advantages of those embodiments.

Figure 1:
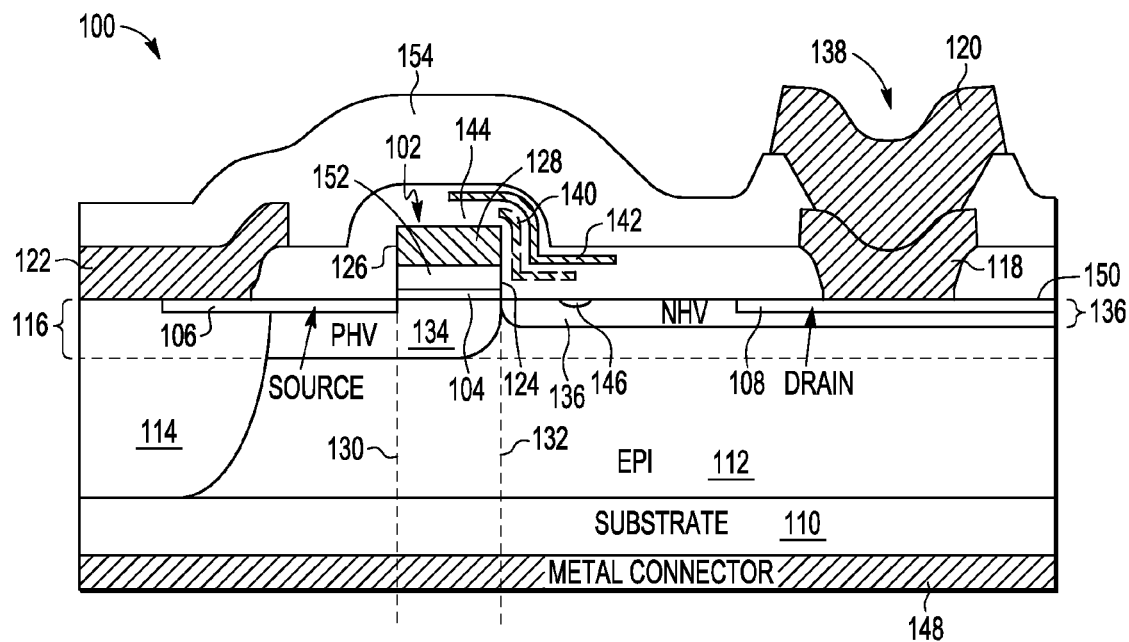
FIG. 1 illustrates a cross-sectional view of a device segment having a shield plate dopant region in accordance with an embodiment.

Embodiments of the present disclosure are illustrated by way of example and are not limited by the accompanying figures. Elements in the figures are illustrated for simplicity and clarity and have not necessarily been drawn to scale. For example, the dimensions of some elements in the figures may be exaggerated relative to other elements to help to improve understanding of the embodiments.

The apparatus and method components have been represented where appropriate by conventional symbols in the drawings. Some drawings show only those specific details that are pertinent to understanding the embodiments, so as not to obscure the disclosure with details that will be readily apparent to those of ordinary skill in the art having the benefit of the description herein. Also, the functions included in the flow diagrams do not imply a required order of performing the functionality contained therein.

DETAILED DESCRIPTION

In accordance with embodiments is a device, such as a transistor, having a set of shield plates and a shield plate dopant region. The shield plate dopant region is formed under at least one of the shield plates within a drift dopant region of the transistor. The shield plate dopant region changes the electric field strength in its surrounding area. This effectively extends the electrical properties of the one or more shield plates and can increase the $BV_{dss}$ of a transistor without certain undesirable effects, like increased capacitance, associated with physically lengthening the shield plates. Moreover, because the shield plate dopant region introduces a higher doping concentration to the drift dopant region, this can result in a lower $R_{dson}$ for the transistor. In some other embodiments, the illustrative advantages can be further realized by varying distances and dopant ions of the shield plate dopant region relative to the transistor's gate. In essence, the shield plate dopant region produces the desired result of both decreasing on-state resistance along with increasing break-down voltage of the transistor.

Figure 2:
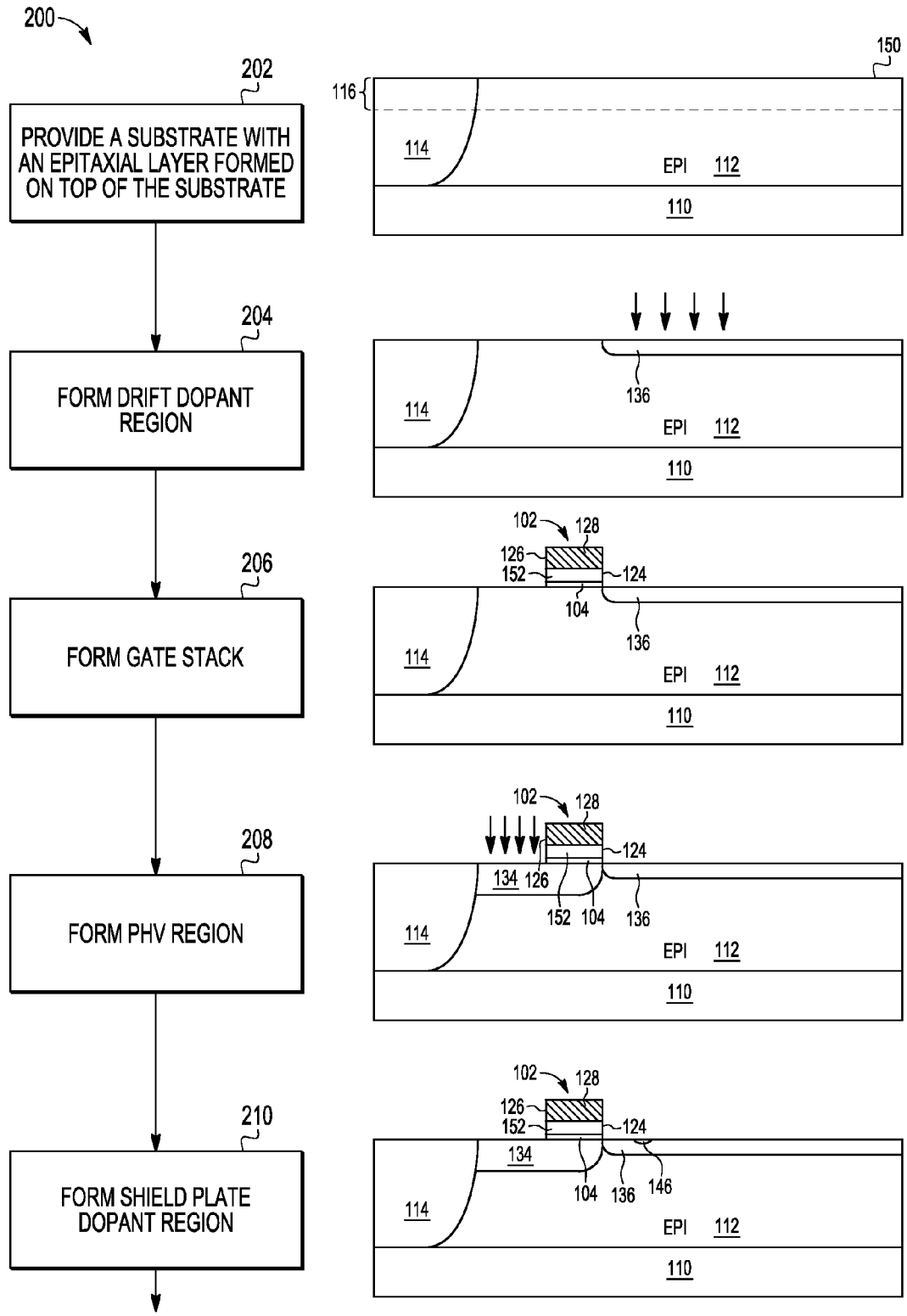
FIGS. 2-3 illustrate the device segment of FIG. 1 at various stages of manufacture and an associated flow diagram for a method of manufacturing apparatus that includes the device segment of FIG. 1.
Figure 3:
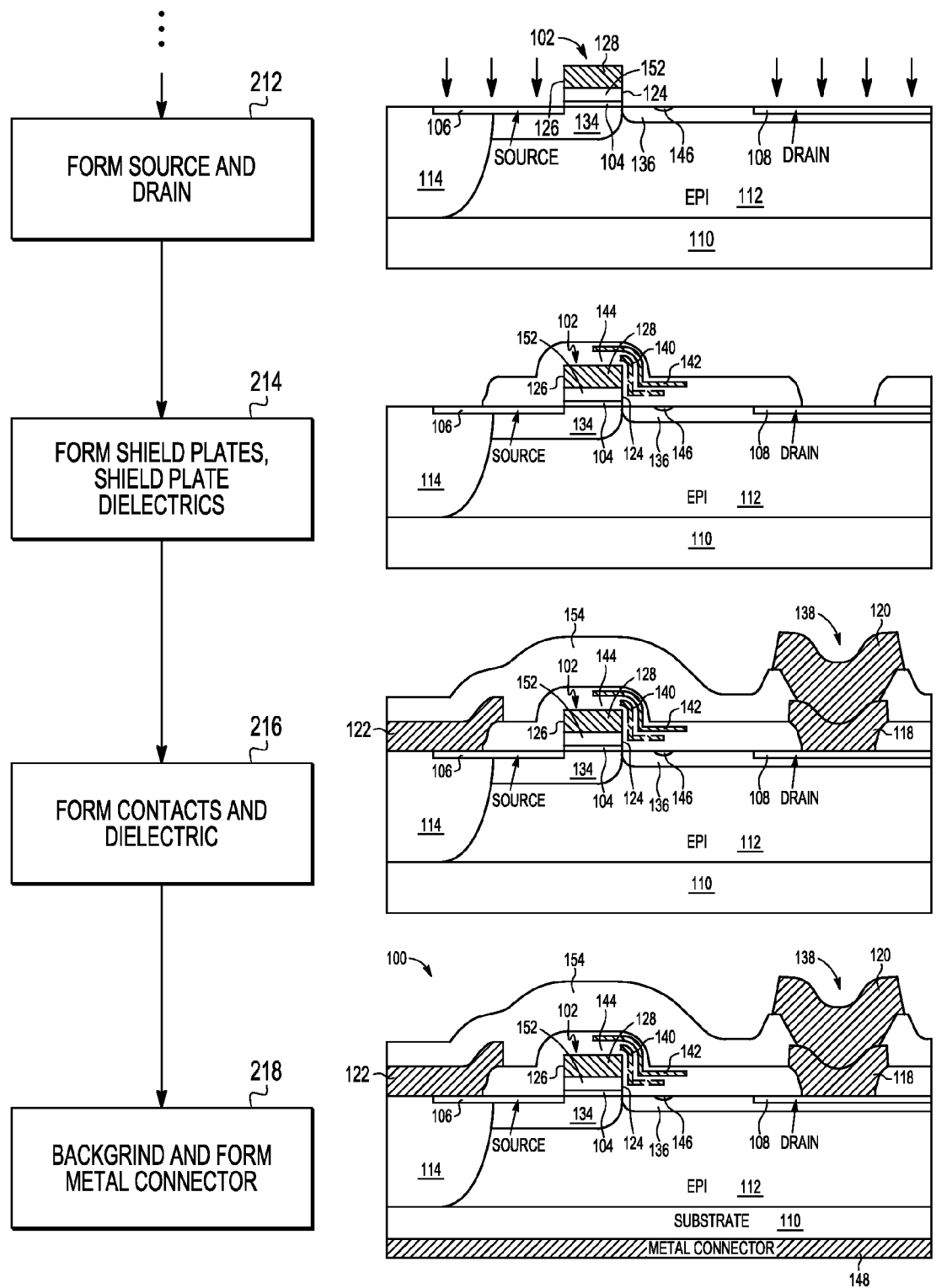

FIG. 1 illustrates a cross-sectional view of a device segment 100 that includes a shield plate dopant region 146 in accordance with an embodiment. FIGS. 2-3 illustrate apparatus that includes a shield plate dopant region at different stages of manufacture and an associated flow diagram for a method 200 of manufacturing the apparatus, in accordance with various embodiments. In a particular implementation scenario, the method 200 uses or is incorporated in a fabrication process used to manufacture the device segment 100 shown in FIG. 1.

For one embodiment, the device segment 100 is included in a semiconductor device such as an integrated circuit on a semiconductor die that includes multiple transistors and perhaps other components. In the particular embodiment illustrated in FIGS. 1-3, the device segment 100 is embodied in a vertically structured n-channel laterally diffused metal oxide semiconductor (LDMOS) field-effect transistor (FET) that can be used in a high power application. Accordingly, the device segment 100 is interchangeably referred to herein as a transistor 100. However, implementation of the teachings herein is not limited to LDMOS FETs but can be applied to other devices. Such devices include, but are not limited to, other semiconductor devices such as other types of metal oxide semiconductor field-effect transistors (MOSFETs), junction field-effect transistors (JFETs), metal-semiconductor field-effect transistors (MESFETs), high-electron-mobility transistors (HEMTs), etc.

Referring to FIG. 2, the method 200, which can be used to manufacture the device segment 100, begins at block 202 by providing a substrate 110 with an epitaxial ("EPI") layer 112 formed on the top surface of the substrate 110, and a region 114 within the EPI layer 112, which is also referred to in the art as a "sinker" region 114. For one example, the substrate 110 includes crystalline or substantially crystalline silicon doped with either a p-type or n-type impurity, also referred to herein as a dopant ion. In some embodiments, the substrate 110 is heavily doped (P+) with boron or another suitable p-type impurity.

Furthermore, the epitaxial layer 112 is a crystalline or substantially crystalline layer that is grown or deposited on the substrate 110. The polarities and doping concentrations of the substrate 110 and the epitaxial layer 112 may be independently controlled during fabrication. In n-channel embodiments of a semiconductor device 100, the epitaxial layer 112 may be formed using a semiconductor material that is lightly doped (P−) with boron or another p-type impurity layer, while the substrate 110 may be more heavily doped (P+) with the same p-type impurity or a different p-type impurity.

As used herein, doping concentration designations such as heavily doped (P+ or N+), moderately doped (P or N), and lightly doped (P− or N−) refer to the following example doping concentrations: P+ or N+ is $>5E^{19}$ cm$^{-3}$; P− or N− is $<5E^{16}$ cm$^{-3}$; and P or N is a concentration in between those two limits. For one embodiment, the epitaxial layer 112 has a thickness in a range of about 15 to 25 microns or micrometers (μm) (e.g., about 19 microns) and a doping concentration in a range of about 1.8E $E^{15}$ cm$^{-3}$ to about 1.9E $E^{15}$ cm$^{-3}$. Epitaxial layer 112 can have other thicknesses and/or doping concentrations, as well. For at least one other embodiment, such as one where the transistor 100 is implemented as a MESFET, the epitaxial layer 112 is constructed at least in part using a material other than a semiconductor material.

For an example, the sinker region 114 within the epitaxial layer 112 may be formed via ion implantation during the growth of the epitaxial layer 112. The sinker region 114 can be constructed, for instance, to extend from an upper or top surface 150 of the EPI layer 112 through the EPI layer 112 to the semiconductor substrate 110. In this example, the sinker region 114 is a relatively heavily doped p-type region which, in the completed device, will electrically connect a source dopant region (such as a source dopant region 106) to contacts (such as a contact 122) and will also electrically connect to a metal connector 148 through a portion of substrate 110. The sinker region 114 can be further configured to lower the inductance of the source dopant region 106 to improve transistor performance. In another embodiment, the sinker region 114 can be replaced with various alternatives, such as through silicon via (TSV).

The epitaxial layer 112 further includes a surface region 116, which represents a portion of the EPI layer 112 that extends from the upper surface 150 of the EPI layer 112 to a designated depth. For a particular example, the surface region 116 represents one quarter to one third of the thickness of the epitaxial layer 112. At least some of the remaining blocks of method 200 are used to form additional regions, layers, and/or elements or components of the device segment 100, which are located above and within the surface region 116. In one implementation, method 200 uses one or more masks (not shown) to form one or more of the doped regions of the device segment 100, wherein openings in the mask(s) are used to define the areas within the EPI 112 in which the various doped regions are formed.

For example, in accordance with block 204, a drift dopant region 136 is formed within the surface region 116. For a particular embodiment, forming the drift dopant region 136 includes forming an n-type high voltage (NHV) region using, for instance, thermal diffusion or ion implantation techniques to introduce, and drive, the dopant ions or impurities into the surface region 116. Forming the drift dopant region 136 may further include using a photoresist masking process in combination with a drive procedure to drive the dopant ions a desired distance into the surface region 116. For one example, the resulting drift dopant region 136 has a low to moderate doping concentration of n-type dopant ions, such as arsenic or phosphorus. For another example, the drift dopant region 136 has a depth, from the top surface 150, within a range of about 0.6 microns to about 4 microns. However, the depth can be smaller or larger, as well.

First and second gate region boundaries 130, 132 define the source and drain sides of the gate 102, respectively. As shown in FIG. 1, the drift dopant region 136 extends from a second gate region boundary 132 to a first area beyond the second gate region boundary 132, relative to an area in which a drain dopant region (or "drain") 108 for the transistor 100 will be formed in a subsequent step. The second gate region boundary 132 is also referred to herein as a drain side boundary since it delineates a side of the surface region 116 within which the drain 108 will be formed.

Method 200 continues, at block 206, with forming a gate stack or simply gate 102 on the surface region 116 of the epitaxial layer 112. Gate 102 has first 124 and second 126 sidewalls. As shown in FIG. 1, the first sidewall 124 aligns with the first gate region boundary 132. The second sidewall 126 aligns with a second gate region boundary 130. The second gate region boundary 130 is also referred to herein as a source side boundary since it delineates a side of the surface region 116 within which the source 106 will be formed in a subsequent step.

For example, forming the gate 102 includes forming a dielectric layer corresponding to a gate dielectric 104 on the surface region 116, and forming layers associated with a gate electrode over the gate dielectric 104 layer. The plurality of layers are then etched to form a gate stack that is defined by the first 126 and second 124 sidewalls. In the illustrated embodiment, the gate electrode includes a lower gate electrode portion 152 and an upper gate electrode portion 128.

In one embodiment, the gate dielectric 104 is a silicon oxide, another material having a suitably high dielectric constant, or a combination of materials that is grown on the surface region 116. Alternatively or additionally, deposition techniques can be used to form the gate dielectric 104. For an embodiment, the thickness of the gate dielectric 104 is in the range of about 5 nanometers (nm) to about 50 nm. Moreover, in an embodiment, the lower gate electrode portion 152 may be doped polysilicon, and the upper gate electrode portion 128 may be a silicide, a metal, or another conductive material such as tungsten silicide (WSi).

Method 200 continues at block 208 with forming a region 134 within the surface region 116. For example, the region 134 is formed using thermal diffusion or ion implantation techniques, and a drive technique can be used to drive the dopant ions a desired distance into the surface region 116. For an n-channel device 100, the region 134 is a p-type high voltage (PHV) region 134. As shown in FIG. 1, the PHV region 134 extends from the sinker region 114 to the drain side boundary 132 (FIG. 1) underlying the gate dielectric 104. Accordingly, a left lateral boundary of the PHV region 134 is adjacent to and abuts the sinker region 114, and a right lateral boundary of the PHV region 134 is adjacent to and abuts the drift dopant region 136. For a particular embodiment, the PHV region 134 has a low (P−) to moderate (P) doping concentration of dopant ions such as about $2\times10^{17}$ cm$^{-3}$. However, in general, the doping concentration and configuration of the PHV region 134 influences the threshold voltage and other turn-on characteristics of the transistor 100, and the doping concentration may be lower or higher than the above-given value.

The method 200 further includes forming, at block 210, a shield plate dopant region 146 within the drift dopant region 136, according to an embodiment. For example, the shield plate dopant region 146 may be formed using masking and ion implantation or thermal diffusion techniques combined with an anneal procedure to introduce dopant ions into an area of the surface region 116 underlying a position at which a set of electrically conductive shield plates (e.g., shield plates 140 and/or 142) will be formed at a subsequent step. For a particular embodiment, the dopant ions are implanted such that the shield plate dopant region 146 has an implant dose in the range of about $3.2 \times 10^{12}$ cm$^{-2}$ to about $3.6 \times 10^{12}$ cm$^{-2}$, and the dopant ions are implanted using an energy level in the range of about 200 kilo-electronvolts (KeV) to about 250 KeV. In other embodiments, the implant concentration and/or dopant energy level may be lower or higher than the above given ranges For embodiments where the device segment 100 is included in a semiconductor device such as a transistor, the shield plate dopant region 146 is formed using dopant ions having an opposite conductivity type (e.g., p-type or n-type) from a conductivity type of the PHV region 134 (and more specifically channel region 402, FIG. 4) and the EPI layer 112. Accordingly, for an n-channel transistor 100 (where the EPI layer 112 and PHV region 134 are formed with p-type dopant ions), the shield plate dopant region 146 is formed using n-type dopant ions. For a particular embodiment, the n-type dopant ions within the shield plate dopant region 146 include arsenic, phosphorus, or antimony dopant ions. Conversely, for a p-channel transistor (where the EPI layer 112 and PHV region 134 are formed with n-type dopant ions), the shield plate dopant region 146 is formed using p-type dopant ions such as boron. Additional details regarding the shield plate dopant region 146 are explained later by reference to FIG. 4.

The method 200 continues in FIG. 3 with forming, in block 212, the source dopant region 106 and the drain dopant region 108 within the surface region 116 of the EPI layer 112. These regions 106 and 108 are formed, for instance, using ion implantation and thermal diffusion techniques. For one example fabrication process, the source 106 and drain 108 dopant regions are formed contemporaneously. For a FET embodiment, the source 106 and drain 108 dopant regions have the same conductivity type (e.g., an opposite conductivity type from the drift dopant region 136) and may be formed using the same kind of dopant ions.

The source dopant region 106 is formed on the source side of the surface region 116, which is defined by the first gate region boundary 130. The source dopant region 106 partially overlies the sinker region 114 and the PHV region 134. For the illustrated transistor 100 embodiment, the source dopant region 106 is directly laterally adjacent to the source side boundary 130.

The drain dopant region 108 is formed on the drain side of the surface region 116, which is defined by the second gate region boundary 132. For the illustrated transistor 100 embodiment, the drain dopant region 108 is laterally displaced from the drain side boundary 132 by a portion of the drift dopant region 136. Particularly, the drift dopant region 136 completely or at least partially surrounds the drain dopant region 108. Accordingly, a first portion of the drift dopant region 136 is disposed between the drain side boundary 132 and the drain dopant region 108, and the drain dopant region 108 overlies a second portion of the drift dopant region 136.

Further to the method 200, a set of one or more shield plates, e.g., shield plates 140 and/or 142, and shield plate dielectric 144 are formed at block 214. In at least one embodiment, forming the set of shield plates includes forming a first dielectric layer of the shield plate dielectric 144 over the gate 102 and the surface region 116, forming a "lower" shield plate 140 over the first dielectric layer, forming a second dielectric layer of the shield plate dielectric 144 over the lower shield plate 140, and forming an "upper" or "topmost" shield plate 142 over the second dielectric layer. An additional dielectric layer may be formed over the upper shield plate 142, and the dielectric structure may be patterned and etched to complete the shield plate dielectric 144 with embedded shield plates 140, 142. In the embodiment shown, the upper shield plate 142 has an end that extends closer to the drain dopant region 108 than an end of the lower shield plate 140. Consequently, the upper shield plate 142 overlies or extends over a first portion of the drift dopant region 136 that is longer in length than a second portion of the drift dopant region 136 over which the lower shield plate 140 extends. Additionally, the upper 142 and lower 140 shield plates are physically and electrically isolated from each other with a layer of the shield plate dielectric 144.

The set of shield plates can have numerous different configurations. For example, the set of shield plates can have additional intermediate shield plates (i.e., one or more shield plates in between the lower and upper shield plates), or the ends of one or more of the shield plates can have a shape that is other than parallel with the top of the surface region 116. The upper 142 and lower 140 shield plates can have the same or different thicknesses and/or be constructed using the same or different materials to achieve the desired electrical characteristics. For instance, using metallization and patterning techniques, the set of electrically conductive shield plates can be formed with at least one shield plate with a portion that overlies the shield plate dopant region 146. Some example shield plate materials include, but are not limited to, doped polysilicon, metal-silicide including a tungsten slice (e.g., WSi), a metal such as aluminum or copper, an alloy, or any other material or combination of materials that exhibits a desirable electrical conductivity.

As indicated previously, the shield plate dielectric 144 is formed from multiple layers (not delineated in the drawings), where the multiple layers may have the same or different thicknesses. The shield plate dielectric layers serve to electrically isolate the shield plates 140 and 142 from each other and from other regions of the device segment 100. For one example, each layer of the shield plate dielectric 144 may be formed using a chemical vapor deposition process to deposit an oxide material having a thickness of about 100 nm to about 1000 nm. The shield plate dielectric layers may be thinner or thicker, in other embodiments.

Conductive contacts 122 and 118 are formed at block 216. For example, contact 122 is formed on the surface region 116 to electrically connect to the source dopant region 106 and to the sinker region 114, and contact 118 is formed on the surface region 116 to electrically connect to the drain dopant region 108.

A dielectric layer 154 (e.g., an oxide layer) is formed over the contacts 122, 118, and an opening in the dielectric layer 154 is formed to expose contact 118. An additional conductive contact 120 is formed over contact 118 to complete drain contact 138. Although a stacked drain contact structure 138 can help to improve device reliability, such a stacked structure is not required.

At block 218, the backside of the substrate 110 is thinned (e.g., using a backgrinding process) and the metal connector 148 is formed thereon. The metal connector 148, which can be made of aluminum for instance, may be used to coupled the transistor 100 to a voltage reference of a packaging structure, which is not shown.

Figure 4:
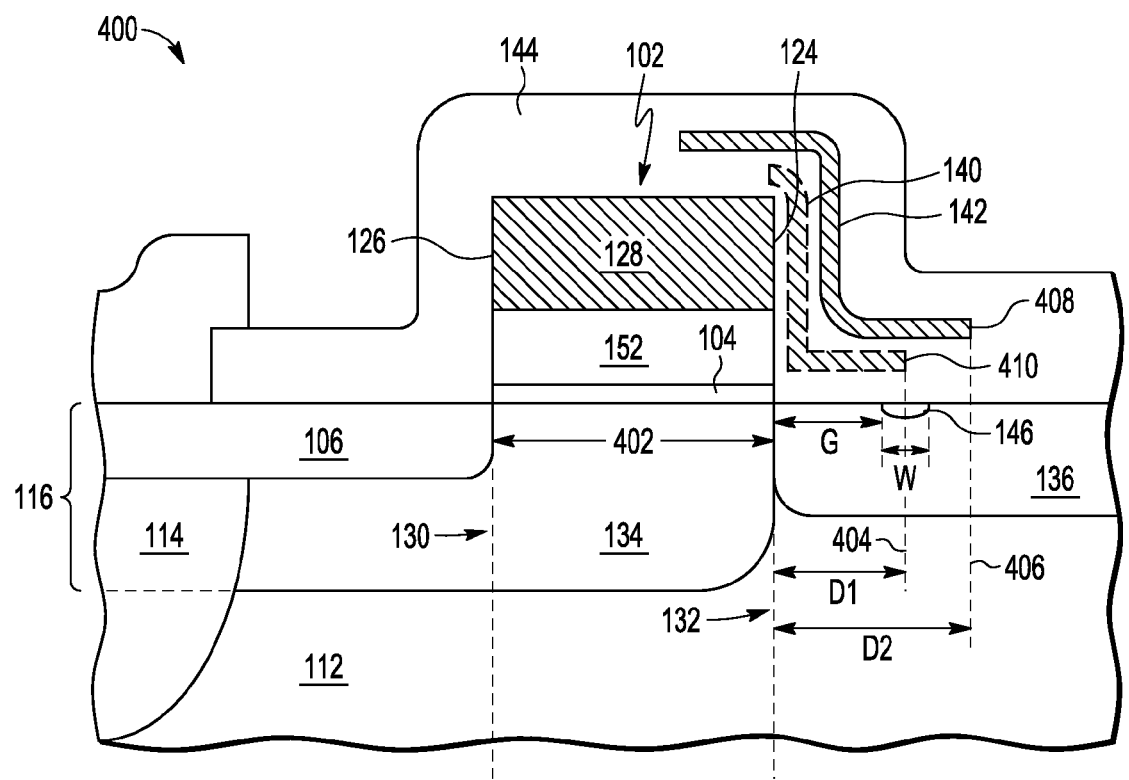
FIG. 4 illustrates an enlarged view of a portion of the device segment of FIG. 1.

FIG. 4 illustrates an enlarged view of a portion 400 of the device segment 100, by which additional aspects of the shield plate dopant region 146 are described. As mentioned earlier, including the shield plate dopant region 146 can positively impact one or more parameters of the transistor 100 performance such as $R_{dson}$ and $BV_{dss}$. However, the effectiveness of the shield plate dopant region 146 can be maximized, at least in part, based on its characteristics and its location within the transistor 100, as described below. For example, increasing doping concentration, which can be enhanced by expanding the region at a constant implant dosage or increasing the implant dosage for a constant dimension, generally improves $BV_{dss}$ and $Rd_{dson}$.

As illustrated in FIG. 4, first 130 and second 132 gate region boundaries define lateral boundaries for a channel region 402 within the surface region 116 and within the PHV region 134. The channel region 402 underlies the gate 102 and is an area where charge carriers can flow during operation of the transistor 100. Placing the shield plate dopant region 146 a gap distance G away from the drain side boundary 132, as illustrated, can aid in avoiding hot carrier injection issues in the transistor 100. In one embodiment, the gap distance G is less than half the length of the drift dopant region 136 to maximize its effectiveness. For instance, the gap distance G may be in a range of about 0.3 to about 0.8 microns, and in a particular embodiment, the gap distance G is about 0.6 microns to about 0.8 microns. Moreover, a width W of the shield plate dopant region 146 need not be large as compared to the length of the drift dopant region 136. For one embodiment, the width W is less than about 1.0 micron or in a particular implementation is about 0.2 to about 1.1 microns, for a drift dopant region 136 having a length in the range of about 5 to about 25 microns. In other embodiments, the gap distance G, width W, and drift dopant region 136 length may be smaller or larger than the above-given ranges.

In the previously described embodiments, the transistor 100 includes two shield plates 140, 142. In an alternate embodiment, the transistor 100 may include a single shield plate, e.g., only the shield plate 142. In such an embodiment, an entirety of the shield plate dopant region 146 may be located between the drain side boundary 132 and a boundary 406 that aligns with an end 408 of the shield plate 142. As shown however, the set of shield plates includes the multiple shield plates 140 and 142, where the end 408 of the topmost shield plate 142 (which is a distance D2 from the drain side boundary 132) is further from the drain side boundary 132 than an end 410 of the shield plate 140 (which is a distance D1 from the drain side boundary 132). In this embodiment as well, the shield plate dopant region 146 does not extend beyond the boundary 406 that aligns with the end 408 of the topmost shield plate 142, and the shield plate dopant region 146 is located entirely between the drain side boundary 132 and the boundary 406.

Further, as shown, the shield plate dopant region 146 underlies both shield plates 142 and 140, although in this embodiment the shield plate dopant region 146 only partially underlies the lower shield plate 140. However, in another embodiment with multiple shield plates, the shield plate dopant region 146 may not underlie all of the shield plates but may be positioned beneath only a subset of the set of shield plates. For example, in one embodiment, the shield plate dopant region 146 may be located between a boundary 404, which aligns with the end 410 of the lower shield plate 140, and the boundary 406, which aligns with the end 408 of the topmost shield plate 142. There may be other arrangements of the shield plate dopant region 146 relative to the channel region 402 and the set of shield plates. Moreover, different sizes and other physical configurations of the shield plate dopant region 146 are envisioned, which are not shown but covered by the present teachings.

Moreover, in the foregoing, specific embodiments have been described. Particularly, in the embodiment illustrated in FIG. 1, the device segment 100 is implemented in an n-channel LDMOS FET with a single gate 102, a source dopant region 106, and a drain dopant region 108, wherein the source dopant region 106 and the drain dopant region 108 are positioned asymmetrically on either side of the channel region 402 located below the gate 102. However, various modifications and changes can be made without departing from the scope of the disclosure as set forth in the claims below. For example, in other embodiments (not depicted), the device 100 can be implemented as a p-channel device and/or include symmetrically arranged source and drain dopant regions. Additionally, certain doping concentrations may be different from those discussed herein, depending on the type of device in which the embodiments are implemented. For example, the channel region 402 may not be doped in some devices (e.g., HEMTs).

For a particular embodiment, a transistor includes a surface region, a gate, source and drain dopant regions, a drift dopant region, a set of electrically conductive shield plates, and a shield plate dopant region. The gate is disposed on the surface region and includes a first sidewall and a second sidewall. The first sidewall aligns with a source side boundary that defines a source side of the surface region, and the second sidewall aligns with a drain side boundary that defines a drain side of the surface region. The source and drain side boundaries define lateral boundaries for a channel region within the surface region underlying the gate. The source dopant region is disposed within the surface region on the source side, and the drain dopant region is disposed within the surface region on the drain side. The drift dopant region is disposed within the surface region between the drain side boundary and the drain dopant region. The set of electrically conductive shield plates includes at least a first shield plate overlying a portion of the drift dopant region. The shield plate dopant region is disposed within the drift dopant region and underlying the set of shield plates.

In accordance with another embodiment is a semiconductor device includes a semiconductor material having a surface region, a gate dielectric, a gate electrode, a drift dopant region, a set of electrically conductive shield plates, and a shield plate dopant region. The gate dielectric overlies the surface region of the semiconductor material, and the gate electrode overlies the gate dielectric. The gate electrode has a first sidewall that aligns with a first gate region boundary and a second sidewall that aligns with a second gate region boundary. The drift dopant region is disposed within the surface region and extends from the second gate region boundary to a distance beyond the second gate region boundary. The set of electrically conductive shield plates overlies at least a portion of the drift dopant region. The shield plate dopant region is disposed within the drift dopant region and underlies the set of shield plates.

The specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendment made during the pendency of this application and all equivalents of those claims as issued.

For the sake of brevity, conventional techniques related to device fabrication, such as semiconductor fabrication may not be described in detail. Furthermore, in this document, relational terms such as first and second, top and bottom, and the like may be used solely to distinguish one entity or action from another entity or action without necessarily requiring or implying any actual such relationship or order between such entities or actions.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A transistor comprising:
   a surface region;
   a gate disposed on the surface region, the gate having a first sidewall and a second sidewall, wherein the first sidewall aligns with a source side boundary that defines a source side of the surface region, and the second sidewall aligns with a drain side boundary that defines a drain side of the surface region, wherein the source and drain side boundaries define lateral boundaries for a channel region within the surface region underlying the gate;
   a drain dopant region disposed within the surface region on the drain side;
   a drift dopant region disposed within the surface region between the drain side boundary and the drain dopant region;
   a set of electrically conductive shield plates that includes at least a first shield plate overlying a portion of the drift dopant region; and
   a shield plate dopant region disposed within the drift dopant region and underlying the set of shield plates.

2. The transistor of claim 1, wherein the set of shield plates further comprises an electrically conductive second shield plate underlying the first shield plate, such that the first shield plate is a topmost shield plate, wherein the second shield plate overlies a second portion of the drift dopant region.

3. The transistor of claim 2, wherein an end of the first shield plate is located further from the drain side boundary than an end of the second shield plate, and wherein an entirety of the shield plate dopant region is located between the drain side boundary and a boundary that aligns with the end of the first shield plate.

4. The transistor of claim 3, wherein the shield plate dopant region only partially underlies the second shield plate.

5. The transistor of claim 1, wherein the shield plate dopant region is disposed a gap distance away from the drain side boundary.

6. The transistor of claim 5, wherein the gap distance is less than half a length of the drift dopant region.

7. The transistor of claim 1, wherein the shield plate dopant region has a width within a range of 0.2 microns to 1.1 microns.

8. The transistor of claim 1, wherein the shield plate dopant region comprises at least one of arsenic, phosphorous, or antimony dopant ions.

9. The transistor of claim 1, wherein the shield plate dopant region comprises dopant ions having an opposite conductivity type as a conductivity type of the channel region, and a same conductivity type as a conductivity type of the drift dopant region.

10. The transistor of claim 1, wherein the transistor is a laterally diffused metal-oxide semiconductor field-effect transistor.

11. The transistor of claim 1, wherein at least one of the shield plates of the set of shield plates aligns with the second sidewall and overlies a top portion of the gate.

12. The transistor of claim 1, wherein at least a portion of the shield plate dopant region extends into the channel region.

13. The transistor of claim 1, wherein the set of shield plates comprises a plurality of shield plates, and the shield plate dopant region underlies only a subset of the set of shield plates.

14. A semiconductor device comprising:
   semiconductor material having a surface region;
   a gate dielectric overlying the surface region of the semiconductor material;
   a gate electrode overlying the gate dielectric, the gate electrode having a first sidewall that aligns with a first gate region boundary and a second sidewall that aligns with a second gate region boundary;
   a drift dopant region disposed within the surface region and extending from the second gate region boundary to an area beyond the second gate region boundary;
   a set of electrically conductive shield plates overlying a portion of the drift dopant region; and
   a shield plate dopant region disposed within the drift dopant region and underlying the set of shield plates.

15. The semiconductor device of claim 14, wherein the semiconductor device is a field-effect transistor.

16. The semiconductor device of claim 14, wherein the set of shield plates comprises a plurality of shield plates having a topmost shield plate, wherein an entirety of the shield plate dopant region is located between the second gate region boundary and a boundary aligned with an end of the topmost shield plate.

17. The semiconductor device of claim 14, wherein the shield plate dopant region comprises dopant ions having a same conductivity type as dopant ions within the drift dopant region.

18. The semiconductor device of claim 14, wherein the drift dopant region has a depth within a range of 0.6 micron to 4 microns.

* * * * *